US012597922B2

(12) United States Patent
Meyer et al.

(10) Patent No.: US 12,597,922 B2
(45) Date of Patent: Apr. 7, 2026

(54) CIRCUIT FOR CONTROLLING A LOAD

(71) Applicant: WAGO Verwaltungsgesellschaft mbH, Minden (DE)

(72) Inventors: Torsten Meyer, Pennigsehl (DE); Christian Voss, Minden (DE)

(73) Assignee: Wago Verwaltungsgesellschaft mbH, Minden (DE)

( * ) Notice: Subject to any disclaimer, the term of this patent is extended or adjusted under 35 U.S.C. 154(b) by 28 days.

(21) Appl. No.: 18/587,206

(22) Filed: Feb. 26, 2024

(65) Prior Publication Data

US 2024/0195407 A1 Jun. 13, 2024

Related U.S. Application Data

(63) Continuation of application No. PCT/EP2022/069714, filed on Jul. 14, 2022.

(30) Foreign Application Priority Data

Aug. 26, 2021 (DE) ..................... 10 2021 122 078.5

(51) Int. Cl.
    *H03K 17/56* (2006.01)
    *H03K 5/24* (2006.01)
(52) U.S. Cl.
    CPC .............. *H03K 17/56* (2013.01); *H03K 5/24* (2013.01)
(58) Field of Classification Search
    CPC ......... H02M 3/33523; H02M 3/33507; H02M 3/335; H02M 3/325; H02M 3/24; H02M 3/22; H02M 1/08; H02M 1/00
    See application file for complete search history.

(56) References Cited

U.S. PATENT DOCUMENTS 7,812,590 B2 10/2010 Kaltenegger et al.
9,584,113 B2 * 2/2017 Niemi .................. H03K 17/687

FOREIGN PATENT DOCUMENTS

DE 4446707 A1 6/1996
EP 2942870 A1 11/2015

OTHER PUBLICATIONS

International Search Report dated Nov. 11, 2022 in corresponding application PCT/EP2022/069714.

* cited by examiner

Primary Examiner — Diana J. Cheng
(74) Attorney, Agent, or Firm — Muncy, Geissler, Olds & Lowe, P.C.

(57) ABSTRACT

A circuit for controlling a load. The circuit includes a semiconductor power switch having a control input, a first power connection and a second power connection, a comparator circuit having a first input, a second input and an output for outputting an output signal, and a voltage source which is galvanically isolated from the load and is arranged to supply the comparator circuit with power. The first input of the comparator circuit is connected to the first power connection of the semiconductor power switch and a supply connection of the comparator circuit is connected to the second power connection of the semiconductor power switch and to the galvanically isolated voltage source.

13 Claims, 5 Drawing Sheets

CIRCUIT FOR CONTROLLING A LOAD

This nonprovisional application is a continuation of International Application No. PCT/EP2022/069714, which was filed on Jul. 14, 2022, and which claims priority to German Patent Application No. 10 2021 122 078.5, which was filed in Germany on Aug. 26, 2021, and which are both herein incorporated by reference.

BACKGROUND OF THE INVENTION

Field of the Invention

The present invention relates to a circuit for controlling a load. In particular, the present invention relates to a circuit for controlling a load comprising a semiconductor power switch and a comparator circuit for monitoring the switching state of the semiconductor power switch.

Description of the Background Art

In order to check a circuit (or a device in which the circuit is arranged) for faults, it may be useful to monitor the outputs of the circuit. For this purpose, for example, a voltage or current output at the output can be measured and the measured value can be fed to a monitoring device, which compares the measured value with an expected value.

SUMMARY OF THE INVENTION

A circuit according to the invention for controlling a load comprises a semiconductor power switch, a comparator circuit and a voltage source which is galvanically isolated from the load. The semiconductor power switch comprises a control input, a first power connection and a second power connection. The comparator circuit comprises a first input, a second input and an output for outputting an output signal. The voltage source, which is galvanically isolated from the load, is arranged to power the comparator circuit. The voltage source, which is galvanically isolated from the load, can, for example, comprise a first voltage output and a second voltage output for powering the comparator circuit.

The first input of the comparator circuit can be connected to the first power connection of the semiconductor power switch. A second supply connection of the comparator circuit is connected to the second power connection of the semiconductor power switch and to the galvanically isolated voltage source. For example, the second supply connection of the comparator circuit can be connected to the second voltage output of the galvanically isolated voltage source.

The term "circuit", can be understood to be, for example, as a combination of electrical and electronic components into a functional unit. The components can, for example, be arranged on a circuit carrier or formed in a semiconductor chip. Furthermore, the term "load", can be understood to be, for example, as an electrical or electronic device which is supplied with electrical energy by the circuit. Furthermore, the term "power connection", can be understood to be, for example, as a connection which, when the circuit is used, serves to supply the electrical or electronic device with energy.

In this regard, the term "semiconductor power switch", can be understood to be, for example, as a switch which comprises at least one power semiconductor via which the supply of electrical energy to the electrical or electronic device can be controlled. Furthermore, the term "control input", can be understood to be, for example, as an input via which the opening and closing of the semiconductor power switch can be effected. The semiconductor power switch may also have further circuitry, such as an input circuit, a filter, a measuring circuit, etc. (e.g. a MOSFET transistor and a shunt, an IGBT, a bipolar transistor, a thyristor, etc.).

Furthermore, the term "comparator circuit", can be understood to be, for example, as a circuit which is arranged to compare two voltages with one another and to generate a signal which reproduces the comparison result. The comparator circuit can, for example, comprise a comparator. Moreover, the comparator circuit can comprise other circuit components, such as an ESD protection circuit, a filter, etc. Furthermore, the term "input" or the term "output", can mean, for example, electrical connections. Here, it may be provided that voltages and/or currents at inputs of a component are generated by other components and voltages and/or currents at outputs of a component are generated by the component itself.

The circuit can be arranged in an input/output module (I/O module). The I/O module can comprise a housing which is designed for mounting the I/O module in series to another I/O module or to a head-end station. The I/O module can also comprise an interface arranged to exchange data with the other I/O module or the head-end station. The inputs and/or outputs of the I/O module can be arranged for reading in status signals and/or for outputting control signals (control voltages and/or control currents). The I/O module can be configurable with regard to deriving the data from the status signals or deriving the control signals from the data. The I/O module can also comprise a memory in which data can be stored from which the configuration of the I/O module can be derived.

In this regard, the term "I/O module", can be understood to be, for example, a device that can be mounted in series or is mounted in series during operation to a head-end station, which connects one or more field devices to the head-end station and optionally (via the head-end station) to a higher-level control unit. Furthermore, the term "head-end station", can be understood to be, for example, a component of a modular fieldbus node whose task is to make the data and/or services of the I/O modules mounted in series to the head-end station available via the fieldbus to which the head-end station is connected.

The head-end station and the I/O module can be arranged to exchange data via electrical signals via a wired transmission path (in particular a local bus). The term "local bus", can be understood to be, for example, a bus via which (only) the I/O modules mounted in series to the head-end station are (directly) connected to each other or to the head-end station. In this regard, the term "interface", can be understood to be, for example, a bus interface arranged for connection to the local bus.

Furthermore, the term "housing", can be understood to be, for example, a structure formed from a solid insulating material in which conductive structures are embedded, wherein the housing typically is designed in such a way that an accidental contact with current-carrying conductors is prevented. In this regard, the term "mounting in series", can be understood to be, for example, the creation of a frictional or form-fitting connection between housings, via which several modules can be connected to one another in series.

Furthermore, the term "module", can be understood to be, for example, a device which can be connected to another device in order to extend the capabilities of the latter, wherein the device can be arranged to be extended by a plurality of modules. Furthermore, the phrase "information relating to a configuration" can include information indicating how to generate process mappings (e.g. how to derive data from signals read in at the inputs of the I/O module and how to transmit the data to the head-end station via the local bus/bus) and/or how to derive control signals (which for example are output at the outputs of the I/O module) from data transmitted from the head-end station to the I/O module via the local bus.

For example, field devices that provide status signals or process control signals can be connected to the inputs and/or outputs. In this regard, the term "field device", can be understood to be, for example, sensors and/or actuators (e.g. connected to the I/O module) that are connected to the I/O module (in terms of signal technology). Furthermore, the I/O module can be a safety-related I/O module. The safety-related I/O module can, for example, comprise redundant channels (e.g. redundant inputs and/or outputs) and/or comprise a dedicated device for monitoring outputs.

Furthermore, the term "voltage source", can be understood to be, for example, a device which is arranged to output a power supply voltage or a power supply current, such as, for example, a primary cell, a secondary cell or a transformer.

The second input of the comparator circuit can be connected to a third voltage output of the galvanically isolated voltage source. The galvanically isolated voltage source can be arranged to output a reference voltage at the third voltage output.

The first voltage output of the galvanically isolated voltage source can be connected to a first supply connection of the comparator circuit.

The circuit can also comprise a first galvanic isolation element, which is connected at the output side to the control input of the semiconductor power switch and to the first voltage output of the galvanically isolated voltage source. The first galvanic isolation element can, for example, be designed as an optocoupler and serve to provide a switching signal to the semiconductor power switch in a galvanically isolated way.

The circuit can also comprise a second galvanic isolation element, which is connected at the input side to the output of the comparator circuit. The second galvanic isolation element can, for example, also be designed as an optocoupler and output a read-back signal.

The circuit can further comprise a first connection terminal and a second connection terminal. The first connection terminal can be connected to the first power connection of the semiconductor power switch. The second connection terminal may be connected to the second power connection of the semiconductor power switch. The circuit may further be designed for selective detachable connection of the load to the first connection terminal or to the second connection terminal.

The circuit may further comprise a resistor connected to the first supply connection of the comparator circuit and to the first input of the comparator circuit.

It should be understood that all steps carried out when using the circuit can be steps of a corresponding method.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
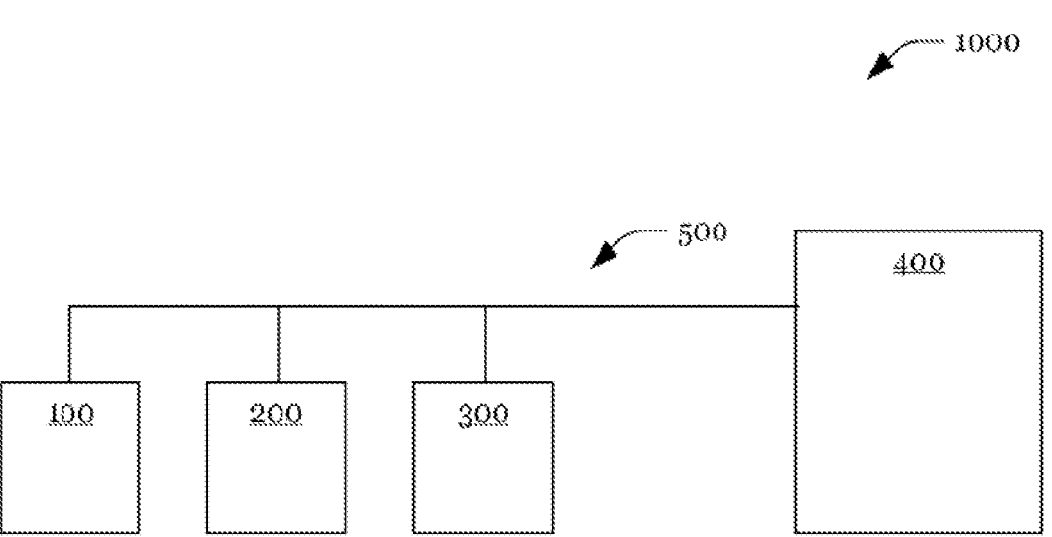
FIG. 1 shows a schematic illustration of a fieldbus system.

FIG. 1 shows a block diagram of fieldbus system 1000. The fieldbus system 1000 comprises fieldbus nodes 100, 200, 300 and 400, which are interconnected via fieldbus 500. Fieldbus node 400 is designed as a higher-level control unit and can be used both for monitoring and for controlling an installation that is controlled by the fieldbus system 1000. When the higher-level control unit 400 monitors an installation, the higher-level control unit 400 can receive status data from one or more of fieldbus nodes 100, 200 and 300 cyclically or acyclically, which describe the status of the installation, and generate an error signal or an alarm signal if the status of the installation deviates (substantially) from a desired/permitted status or status range.

If the higher-level control unit 400 (not only monitors, but also) controls the installation, the higher-level control unit 400 can receive status data cyclically or acyclically from one or more of fieldbus nodes 100, 200 and 300 and, taking into account the status data, determine control data that are transmitted to one or more of fieldbus nodes 100, 200 and 300.

Figure 2:
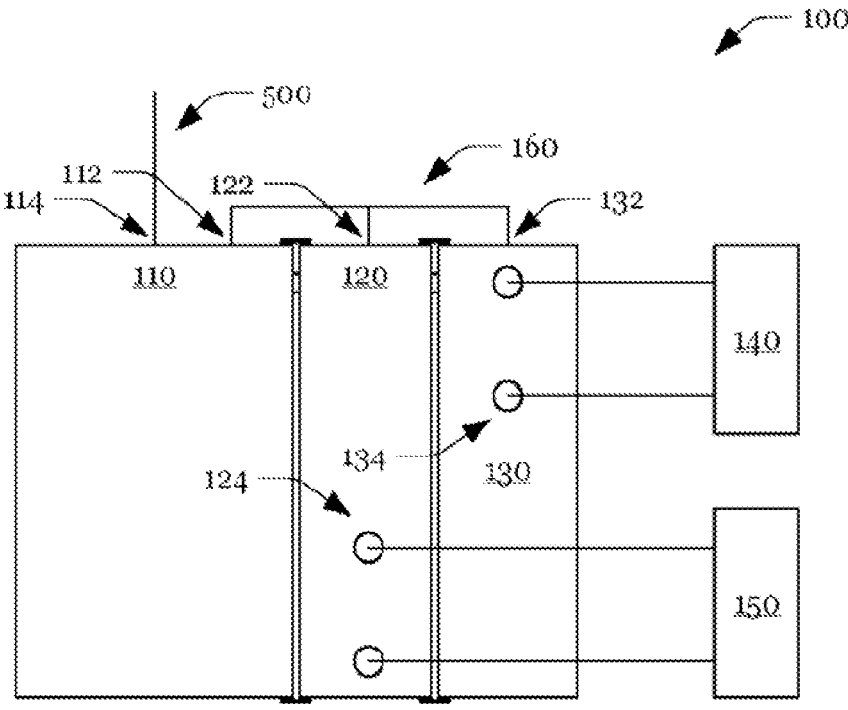
FIG. 2 shows a schematic illustration of a fieldbus node of the fieldbus system shown in FIG. 1.

FIG. 2 shows a modular fieldbus node 100, formed of a head-end station 110 and two I/O modules 120 and 130 which are mounted in series to head station 110 and to which the sensor 140 and the actuator 150 are connected. During operation, I/O module 130 reads in sensor signals via input 134 and generates status data from the sensor signals, which are transmitted to the head-end station 110 via the interface 132, the local bus 160 and the interface 112. In addition to (fieldbus) interface 114, the head-end station 110 can comprise a processor and a memory in which information regarding a configuration of the head-end station 110 is stored.

The information regarding the configuration of the head-end station 110 can, for example, specify which or how many I/O modules are connected in series to the head-end station 110 and how head-end station 110 should handle the received status data. Head-end station 110 can, for example, process the status data locally and/or forward them (possibly in a modified form) to the higher-level control unit 1000 via interface 114 and fieldbus 500. Higher-level control unit 1000 (or, in the case of local processing, head-end station 110) can then generate control data by taking into account the status data.

The control data generated by the higher-level control unit 1000 can then be transmitted to the head-end station 110 via fieldbus 160. The control data transmitted to the head-end station 110 (or generated by the head-end station 110) are then forwarded/transmitted (possibly in a modified form) to I/O module 120. I/O module 120 receives the control data and outputs control signals corresponding to the control data to output 124, to which actuator 150 is connected. The communication of data between the components of field bus system 1000 and the mapping of sensor signals to status data and the mapping of control data to control signals can here be adapted to different application scenarios by configuring field bus nodes 100.

Figure 3:
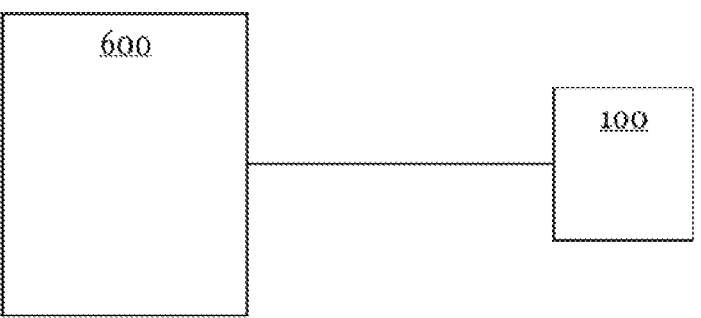
FIG. 3 illustrates the configuration of the fieldbus node shown in FIG. 2 via a computer connected to the fieldbus node.

FIG. 3 shows a fieldbus node 100 and a computer 600 (e.g. a desktop, a laptop, a tablet, etc.) which is connected to fieldbus node 100 and is arranged to configure I/O module 120 and I/O module 130 of fieldbus node 100. Computer 600 can be used solely or predominantly for configuration purposes and can also execute other tasks (in addition to configuration). In particular, computer 600 can be part of the higher-level control unit 400 and, in addition to configuration, can also execute monitoring and/or control tasks. For example, computer 600 can monitor the installation and be arranged to switch from one operating mode to another operating mode when certain conditions are present (and to change or update the configuration in the course of the switchover, if necessary).

Figure 4:
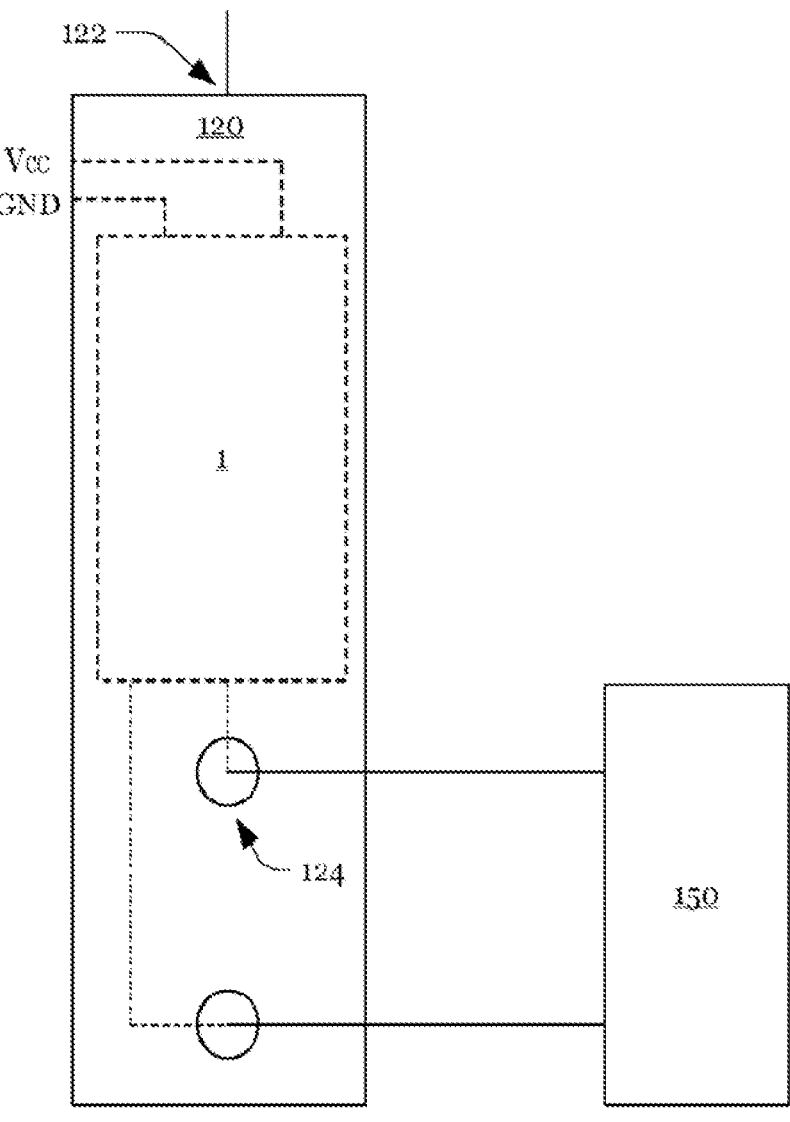
FIG. 4 shows a circuit for controlling a load, which is arranged in an I/O module of the fieldbus node shown in FIG. 2.

As shown in FIG. 4, the I/O module 120 comprises the circuit 1, which controls the actuator 150. The control can take place by supplying the actuator 150 with energy or by disconnecting the actuator 150 from an energy source. In other words, circuit 1 can control the actuator 150 by activating or deactivating actuator 150 by circuit 1. Circuit 1 can be formed on a circuit carrier such as a printed circuit board. Alternatively, circuit 1 can be formed on a semiconductor chip (for example, as an integrated circuit).

Figure 5:
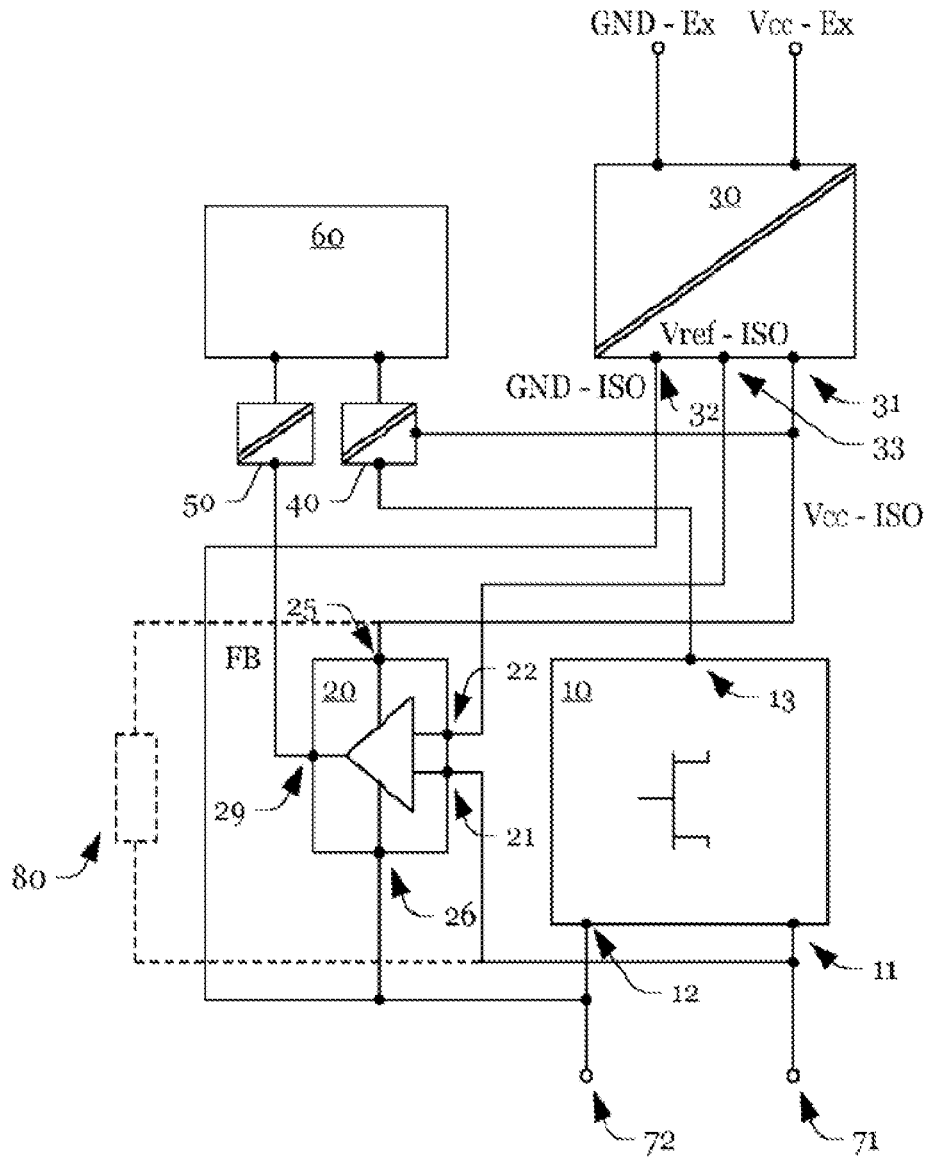
FIG. 5 shows an exemplary configuration of the circuit shown in FIG. 4.

As shown in FIG. 5, circuit 1 comprises a semiconductor power switch 10, a comparator circuit 20, a galvanically isolated voltage source 30, galvanic isolation elements 40 and 50 and a switching circuit 60, which is arranged for switching the semiconductor power switch 10 and for reading in an output signal indicating the switching state of the semiconductor power switch 10. Switching circuit 60 can also be arranged to generate an error signal if the read-back switching state (e.g. open or closed) deviates from a desired switching state (in particular the switching state specified by switching circuit 60). The switching circuit 60 can also be arranged to transmit the read-back switching state to the head-end station 110.

The semiconductor power switch 10 comprises a control input 13 and power connections 11 and 12. If the semiconductor power switch 10 is closed, power connection 11 and power connection 12 are electrically conductively connected to each other. If semiconductor power switch 10 is open, power connection 11 and power connection 12 are electrically isolated from each other. The semiconductor power switch 10 comprises at least one power semiconductor, but can also comprise additional circuitry (input circuit, filter, measuring circuit, etc.): (e.g. =MOSFET transistor, IGBT, bipolar transistor, thyristor).

The comparator circuit 20 comprises inputs 21 and 22, supply connections 25 and 26 and an output 29 for outputting an output signal FB. Comparator circuit 20 comprises a comparator which (can be connected in parallel to the semiconductor power switch 10 and) compares the voltage values of two input signals with each other and indicates which of the input signals has the higher/lower voltage value. In addition, comparator circuit 20 can comprise further circuit components such as an ESD protection circuitry, filters, etc. Input 21 is connected to power connection 11. Input 22 is connected to voltage output 33 of voltage source 30, wherein voltage source 30 is arranged to output a reference voltage (Vref-ISO) at voltage output 33.

The supply connections 25 and 26 are connected to voltage output 31 or voltage output 32 of voltage source 30, wherein the voltage source 30 is arranged to output a power supply voltage ($V_{CC}$-ISO) at voltage output 31 and the reference potential (GND-ISO) at voltage output 32. Voltage source 30 can comprise a transformer for galvanic isolation, for example, although alternative design options such as a battery are also possible. Supply connection 26 is further connected to power connection 12. Furthermore, a (e.g. high-impedance) resistor 80 can be connected to input 21 and supply connection 25, which makes it possible to check circuit 1 for faults even in the unloaded state. Instead of resistor 80, a test voltage can also be generated by use of other components.

The galvanic isolation element 40, which can be designed as an optocoupler, for example, is connected to control input 13 at the output side. In this way, a galvanically isolated switching signal can be applied to semiconductor power switch 10. The galvanic isolation element 40 is further connected to voltage output 31. Alternatively, the galvanic isolation element 40 can also be connected to voltage output 32.

The galvanic isolation element 50, which can likewise be designed as an optocoupler, for example, is connected at the input side to output 29 of the comparator circuit 20. At the output side, the galvanic isolation element 50 is connected to switching circuit 60 and provides the latter with a galvanically isolated read-back signal with regard to the switching state of semiconductor power switch 10. The galvanically isolated read-back signal is based on the voltage at power connection 11, which is dependent on the switching state of semiconductor power switch 10, and the reference voltage and circuit 60 can be arranged to output an error signal if the galvanically isolated read-back signal is outside a tolerance range. This allows both circuit-internal and circuit-external faults (e.g. short circuits) to be detected.

For example, circuit 60 and comparator circuit 20 can form a read-back circuit that evaluates the differential voltage across semiconductor power switch 10. If the semiconductor power switch 10 is closed, the differential voltage approaches 0. If the semiconductor power switch 10 is open, the voltage can be measured.

Figure 6:
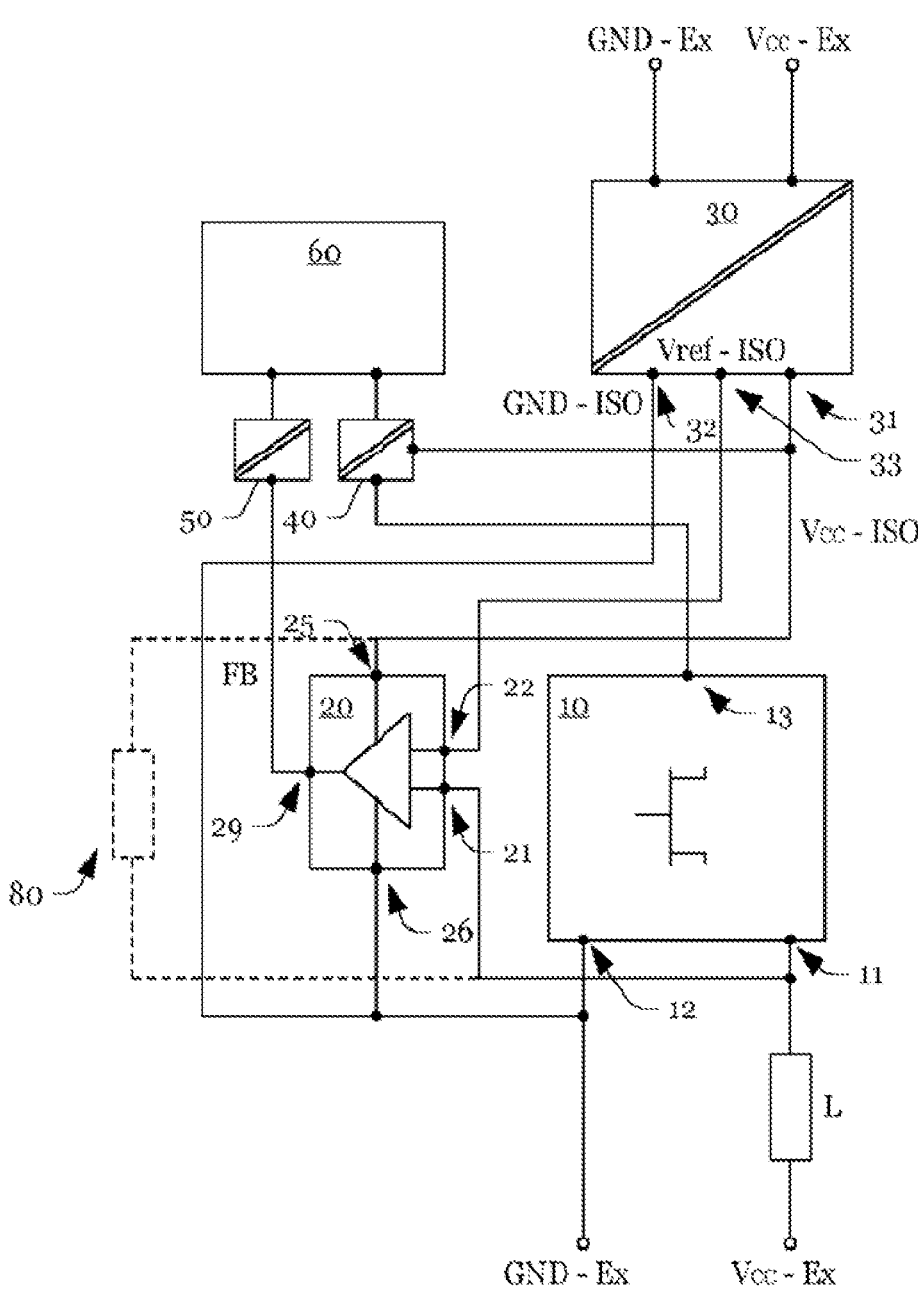
FIG. 6 illustrates a first arrangement for controlling a load by use of the circuit shown in FIG. 5.
Figure 7:
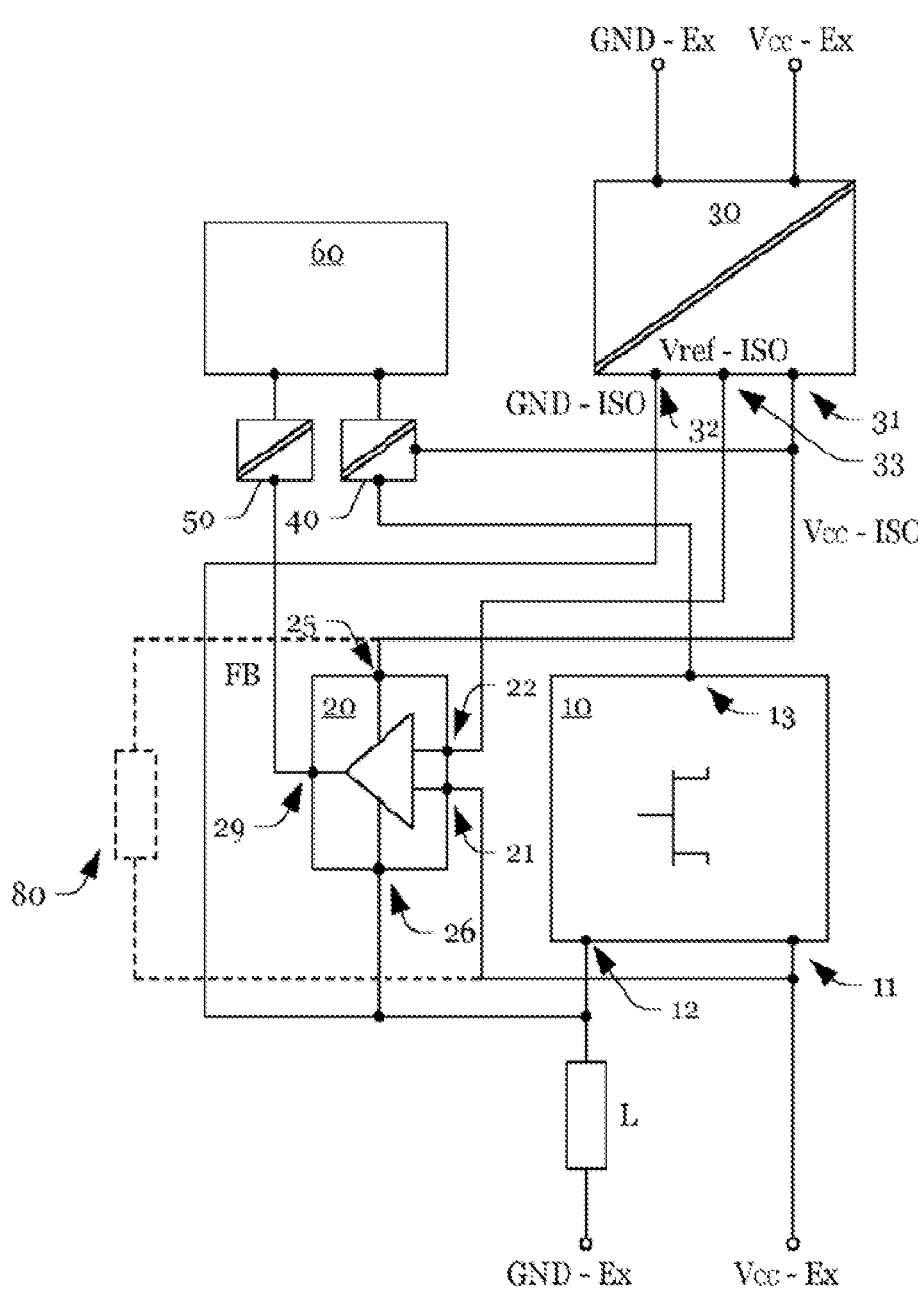
FIG. 7 illustrates a second arrangement for controlling a load by use of the circuit shown in FIG. 5.

Circuit 1 also comprises the connection terminal 71, which is connected to power connection 11 of the semiconductor power switch 10, and connection terminal 72, which is connected to power connection 11 of the semiconductor power switch 10. As illustrated in FIG. 6 and FIG. 7, connection terminal 71 and connection terminal 72 are designed for selective detachable connection of load L to connection terminal 71 or connection terminal 72, wherein the load L is connected to connection terminal 71 in FIG. 6 and to connection terminal 72 in FIG. 7. Connection terminals 71 and 72 can thus be wired potential-free and the semiconductor power switch 10 can be used either as a power supply voltage-switching or as a ground-switching output. Connection terminals 71 and 72 can also be designed as terminal points of I/O module 120.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A circuit to control a load, the circuit comprising:
a semiconductor power switch comprising a control input, a first power connection, and a second power connection;
a comparator circuit comprising a first input, a second input, and an output to output an output signal; and
a voltage source that is galvanically isolated from the load and is arranged to supply the comparator circuit with power,
wherein the first input of the comparator circuit is connected to the first power connection of the semiconductor power switch, and
wherein a supply connection of the comparator circuit is connected to the second power connection of the semiconductor power switch and to the galvanically isolated voltage source.

2. The circuit according to claim 1, wherein the second input of the comparator circuit is connected to a voltage output of the galvanically isolated voltage source, and wherein the galvanically isolated voltage source is arranged to output a reference voltage at the voltage output.

3. The circuit according to claim 1, wherein a voltage output of the galvanically isolated voltage source is connected to a supply connection of the comparator circuit.

4. The circuit according to claim 1, further comprising a galvanic isolation element that is connected at the output side to the control input of the semiconductor power switch and to the voltage output of the galvanically isolated voltage source, wherein the galvanically isolated voltage source is connected to the supply connection of the comparator circuit.

5. The circuit according to claim 1, further comprising a galvanic isolation element that is connected at the input side to the output of the comparator circuit.

6. The circuit according to claim 1, further comprising:
a first connection terminal that is connected to the first power connection of the semiconductor power switch; and a second connection terminal that is connected to the second power connection of the semiconductor power switch,
wherein the circuit is configured to selectively detachably connect the load to the first connection terminal or to the second connection terminal.

7. The circuit according to claim 1, further comprising a resistor that is connected to the first supply connection of the comparator circuit and to the first input of the comparator circuit.

8. The circuit according to claim 1, wherein the voltage source comprises a first voltage output and a second voltage output.

9. The circuit according to claim 1, further comprising a switching circuit.

10. The circuit according to claim 1, further comprising:
a first galvanic isolation element connected to the control input of the semiconductor power switch; and
a second galvanic isolation element connected to the output of the comparator circuit.

11. The circuit according to claim 10, wherein the first galvanic isolation element and the second galvanic isolation element are designed as optocouplers.

12. The circuit according to claim 1, wherein the voltage source comprises a transformer for galvanic isolation.

13. A fieldbus system, comprising:
a field bus node, comprising a I/O module, the I/O module housing a circuit to control a load, the circuit comprising:
a semiconductor power switch comprising a control input, a first power connection, and a second power connection;
a comparator circuit comprising a first input, a second input, and an output to output an output signal; and
a voltage source that is galvanically isolated from the load and is arranged to supply the comparator circuit with power,
wherein the first input of the comparator circuit is connected to the first power connection of the semiconductor power switch, and
wherein a supply connection of the comparator circuit is connected to the second power connection of the semiconductor power switch and to the galvanically isolated voltage source.

* * * * *